United States Patent [19]
Yu

[11] Patent Number: 6,014,305
[45] Date of Patent: Jan. 11, 2000

[54] ESD EVENT DETECTOR

[75] Inventor: Ta-Lee Yu, Hsinchu, Taiwan

[73] Assignee: Winbond Electronics Corp., Hsinchu, Taiwan

[21] Appl. No.: 09/130,289

[22] Filed: Aug. 6, 1998

[30] Foreign Application Priority Data

Jun. 9, 1998 [TW] Taiwan ................................. 87109187

[51] Int. Cl.$^7$ ..................................................... H02H 3/22
[52] U.S. Cl. ............................................. 361/111; 361/56
[58] Field of Search ............................... 361/56, 91, 111; 365/185.25

[56] References Cited

U.S. PATENT DOCUMENTS

| | | | |
|---|---|---|---|
| 5,416,661 | 5/1995 | Furuta | 361/56 |
| 5,661,686 | 8/1997 | Gotou | 365/185.23 |
| 5,754,074 | 5/1998 | Kelly | 327/434 |
| 5,869,873 | 2/1999 | Yu | 257/362 |

*Primary Examiner*—Michael J. Sherry
*Attorney, Agent, or Firm*—Ladas & Parry

[57] ABSTRACT

An ESD event detector in accordance with the present invention is implemented by an amplifier-like structure, an input device of which is constituted by a non-volatile memory transistor. The instantaneous high voltage while an ESD pulse stresses at an integrated circuit pad alters the threshold voltage of the input device. Thereafter, the DC offset of the amplifier-like device is measured to know whether or not an ESD event occurred during the phases of testing, assembly, installation, or operation.

17 Claims, 2 Drawing Sheets

ESD EVENT DETECTOR

BACKGROUND OF THE INVENTION

1. Field of the Invention

The present invention relates to semiconductor integrated circuit technologies. More particularly, the present invention relates to an electrostatic discharge event detector which can record any ESD event occurring during the phases of testing, assembly, installation, operation, and so on.

2. Description of the Related Art

Electrostatic discharge, ESD hereinafter, may occur anytime during the phases of testing, assembly, installation, operation, etc., and cause damage to integrated circuits (ICs). Thus, as for semiconductor integrated circuitry, an ESD protection circuit is generally provided in close proximity to the integrated circuit pads to protect an internal circuit (also referred to as core circuitry) from ESD damage.

Most conventional ESD protection circuits are constituted by, for example, diodes, field devices (transistors formed on field oxides), lateral silicon-controlled rectifiers, or low voltage triggering silicon-controlled rectifiers (LVTSCR). In general, the conventional ESD protection circuit should be triggered at a voltage lower than the breakdown voltage of those devices contained in the internal circuit most vulnerable to ESD damage. The conventional ESD protection circuit is triggered to conduct a discharge current and thus keep the ESD stress far away from the internal circuit.

However, other than the situation in which the ESD stress causes permanent damage to the ESD protection circuit, there is no way of knowing whether or not ESD stress occurred during the phase of testing, assembly, installation, operation, etc. In other words, the conventional ESD protection circuit can not record the ESD event without failure.

SUMMARY OF THE INVENTION

It is therefore an object of the present invention to provide an ESD event detector in conjunction with an ESD protection circuit, both of which are connected to an integrated circuit pad, to record any ESD event during the phases of testing, assembly, installation, operation, and so on.

The present invention achieves the above-indicated objects by providing an ESD event detector connected to an integrated circuit pad in conjunction with an ESD protection circuit. The ESD event detector comprises an amplifier-like device which is provided with one input element connected to the integrated circuit pad and constituted by one non-volatile memory transistor.

Furthermore, the present invention achieves the above-indicated objects by providing an integrated circuit comprising a pad, an internal circuit electrically coupled to the pad, an ESD protection circuit connected to the pad to conduct a discharge path during an ESD event, and an ESD event detector connected to the pad to record the ESD event.

Therefore, the ESD event detector in accordance with the present invention is implemented by an amplifier-like structure, the input device of which is constituted by a non-volatile memory transistor. The instantaneous high voltage while an ESD pulse stresses at the integrated circuit pad 1 alters the threshold voltage of the input device. Thereafter, the DC offset of the amplifier-like device is measured to know whether or not any ESD event occurred during the phases of testing, assembly, installation, or operation.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
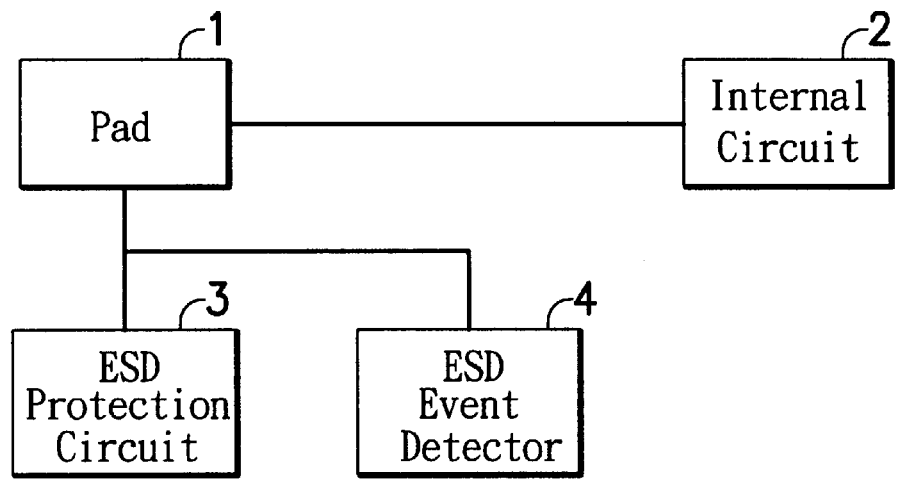
FIG. 1 schematically depicts the block diagram of an ESD event detector of the present invention and an ESD protection circuit, both connected to an integrated circuit pad.

Referring to FIG. 1, the block diagram of an ESD event detector of the present invention and an ESD protection circuit, both connected to an integrated circuit pad, is schematically depicted. In the drawing, reference numeral 1 designates the integrated circuit pad, which is electrically coupled to an internal circuit (also referred to as core circuitry) 2. In other words, the internal circuit 2 inputs or outputs signals, or is powered by an external power supply such as $V_{DD}$ or $V_{SS}$, through the integrated circuit pad 1.

To prevent the internal circuit 2 from ESD damage, an ESD protection circuit 3 is connected to the integrated circuit pad 1, which is triggered at a voltage less than, for example, the breakdown voltage of gate oxides contained in the internal circuit 2. Thus, the ESD protection circuit 3 can be triggered to conduct a discharge current and keep any occurring ESD stress far away from the internal circuit 2. Generally, the ESD protection circuit 3 is constituted of diodes, field devices (transistors formed on field oxides), lateral silicon-controlled rectifiers, or low voltage triggering silicon-controlled rectifiers.

According to the present invention, an ESD event detector 4 is further provided to record any ESD event occurring during the phases of testing, assembly, installation, or operation. Preferably, the ESD event detector 4 and the ESD protection circuit 3 are connected to the integrated circuit pad 1 in parallel.

To implement the aforementioned ESD event detector 4, an input device is provided to alter its threshold voltage in response to instantaneous high voltage when an ESD pulse stresses at the integrated circuit pad 1. Thereafter, the ESD event detector 4 is subjected to voltage offset measurement to detect whether or not an ESD event occurred. However, according to the present invention, an amplifier-like device implements the ESD event detector 4. Because the input device in accordance with the present invention is constituted by a non-volatile memory transistor, the term "amplifier-like device" is used to distinguish it from the conventional amplifiers.

Figure 2:
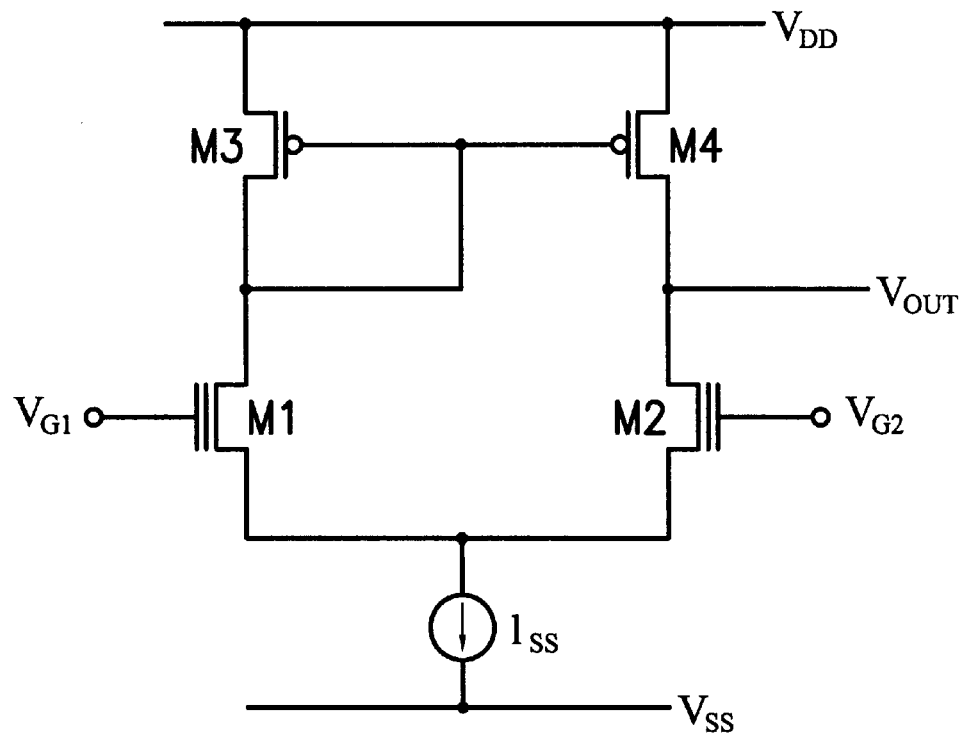
FIG. 2 depicts the circuit diagram of an ESD event detector in accordance with one preferred embodiment of the present invention.

Referring to FIG. 2, the circuit diagram of an ESD event detector in accordance with one preferred embodiment of the present invention is shown. In FIG. 2, the ESD event detector 4 comprises two non-volatile memory transistors $M_1$ and $M_2$, two P-type field-effect transistors $M_3$ and $M_4$, and a current source $I_{SS}$. The P-type field-effect transistors $M_3$ and $M_4$ are configured with their sources connected together to the $V_{DD}$ node, and their gates connected together to the drain of the non-volatile memory transistor $M_1$. The P-type field-effect transistor $M_4$ has its drain connected to the drain of the non-volatile memory transistor $M_2$ to be an output terminal $V_{OUT}$, while the P-type field-effect transistor $M_3$ has its drain connected to the drain of the non-volatile memory transistor $M_1$. Both sources of the non-volatile memory transistor $M_1$ and $M_2$ are connected to $V_{SS}$ by the current source $I_{SS}$. Moreover, the control gate $V_{G1}$ of the non-volatile memory transistor $M_1$ is connected to the integrated circuit pad 1, and the control gate $V_{G2}$ of the non-volatile memory transistor $M_2$ is floating.

General speaking, the circuit shown in FIG. 2 is similar to a differential amplifier structure, but N-type field-effect transistors are replaced by the non-volatile memory transistors $M_1$ and $M_2$. However, by making use of the symmetrical characteristics of the input devices of the differential amplifier, measurement of the DC offset at the output terminal $V_{OUT}$ can be performed to determine whether or not the threshold voltages of the non-volatile memory transistors $M_1$ and $M_2$ are identical. Therefore, in the manufacture of the non-volatile memory transistors $M_1$ and $M_2$, their threshold voltages are adjusted to be the same, for instance, 1~2 V. If an ESD pulse occurs during the phases of testing, assembly, installation, or operation, the instantaneous high voltage makes the non-volatile memory transistor $M_1$ perform a program or erase operation, thereby altering the corresponding threshold voltage. For example, the instantaneous high voltage applied to the control gate $V_{G1}$ of the non-volatile memory transistor $M_1$ extracts the electrons stored in the floating gate and thus decreases the corresponding threshold voltage of the non-volatile memory transistor $M_1$ to the range of about 1 mV~0.1 V, while the non-volatile memory transistor $M_2$ remains the original threshold voltage. Accordingly, the occurrence of the ESD event can be detected by measuring the DC offset at the output terminal $V_{OUT}$.

The aforementioned non-volatile memory transistors $M_1$ and $M_2$ can be erasable programmable read-only memory (EPROM) transistors, electrically erasable programmable read-only memory (EEPROM) transistors, or, preferably, flash memory transistors.

Figure 3:
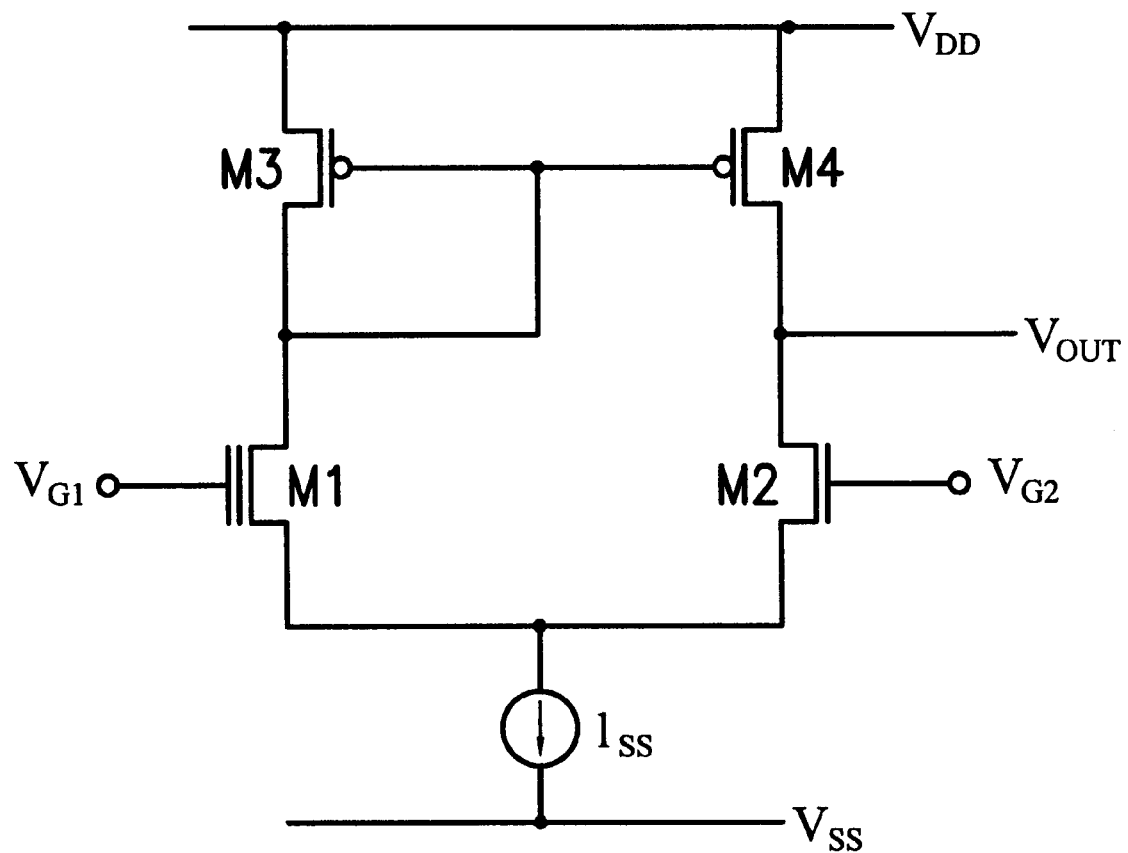
FIG. 3 depicts the circuit diagram of an ESD event detector in accordance with another preferred embodiment of the present invention.

Referring to FIG. 3, the circuit diagram of an ESD event detector in accordance with another preferred embodiment of the present invention is depicted. The preferred embodiment as shown in FIG. 3 differs from the embodiment of FIG. 2 in that the device $M_2$ is an N-type field-effect transistor. For the same reason, the device $M_1$ and $M_2$ are fabricated and adjusted to have the same threshold voltage, for instance, 1~2 V. If an ESD pulse occurs during the phases of testing, assembly, installation, or operation, the instantaneous high voltage makes the non-volatile memory transistor $M_1$ perform a program or erase operation, thereby altering the corresponding threshold voltage. For example, the instantaneous high voltage to the control gate $V_{G1}$ of the non-volatile memory transistor $M_1$ extracts the electrons stored in the floating gate and thus decreases the corresponding threshold voltage of the non-volatile memory transistor. $M_1$ to the range of about 1 mV~0.17 while the N-type field-effect transistor $M_2$ remains the original threshold voltage. Accordingly, the occurrence of the ESD event can be detected by measuring the DC offset at the output terminal $V_{OUT}$.

In conclusion, the ESD event detector 4 in accordance with the present invention is implemented by an amplifier-like structure, the input device of which is constituted by a non-volatile memory transistor. The instantaneous high voltage occurring when an ESD pulse stresses at the integrated circuit pad 1 alters the threshold voltage of the input device. Thereafter, the DC offset of the amplifier-like device is measured to determine whether or not any ESD event occurred during the phases of testing, assembly, installation, or operation.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. An ESD event detector connected to an integrated circuit pad, said ESD event detector comprising:

a differential amplifier which is provided with one input device element connected to said integrated circuit pad and constituted by one non-volatile memory transistor.

2. The ESD event detector as claimed in claim 1, wherein said differential amplifier further comprises another input element.

3. The ESD event detector as claimed in claim 2, wherein said another input element is constituted by another non-volatile memory transistor.

4. The ESD event detector as claimed in claim 3, wherein said another non-volatile memory transistor has a floating control gate.

5. The ESD event detector as claimed in claim 2, wherein said another input element is constituted by an N-type field-effect transistor.

6. The ESD event detector as claimed in claim 5, wherein said N-type field-effect transistor has a floating gate.

7. An integrated circuit, comprising:

a pad;

an internal circuit electrically coupled to said pad;

an ESD protection circuit connected to said pad to provide a discharge path during an ESD event; and an ESD event detector connected to said pad to record said ESD event.

8. The integrated circuit as claimed in claim 7, wherein said ESD event detector comprises an amplifier-like device which is provided with one input element connected to said integrated circuit pad and constituted by one non-volatile memory transistor.

9. The ESD event detector as claimed in claim 8, wherein said amplifier-like device is a differential amplifier-like device.

10. The ESD event detector as claimed in claim 9, wherein said amplifier-like device further comprises another input element.

11. The ESD event detector as claimed in claim 10, wherein said another input element is constituted by another non-volatile memory transistor.

12. The ESD event detector as claimed in claim 11, wherein said another non-volatile memory transistor has a floating control gate.

13. The ESD event detector as claimed in claim 10, wherein said another input element is constituted by an N-type field-effect transistor.

14. The ESD event detector as claimed in claim 13, wherein said N-type field-effect transistor has a floating gate.

15. A method of recording an ESD event, comprising:

connecting an ESD event detector to an integrated circuit pad; and recording the occurrence of ESD stress by said ESD event detector while said ESD stress occurs at said integrated circuit pad.

16. The method as claimed in claim 15, further comprising the step of connecting an ESD protection circuit to said integrated circuit pad.

17. The method as claimed in claim 15, wherein said ESD event detector has a non-volatile memory device used to record said ESD stress.

* * * * *